United States Patent [19]

Morozumi

[11] Patent Number: 5,514,624
[45] Date of Patent: May 7, 1996

[54] METHOD OF MANUFACTURING A MICROELECTRONIC INTERLAYER DIELECTRIC STRUCTURE

[75] Inventor: Yukio Morozumi, Suwa, Japan

[73] Assignee: Seiko Epson Corporation, Japan

[21] Appl. No.: 93,377

[22] Filed: Jul. 19, 1993

Related U.S. Application Data

[63] Continuation-in-part of Ser. No. 741,285, Aug. 7, 1991, Pat. No. 5,266,525.

[30] Foreign Application Priority Data

Aug. 7, 1990 [JP] Japan ................... 2-208980

[51] Int. Cl.$^6$ .................................................. H01L 21/44
[52] U.S. Cl. .................... 437/195; 437/231; 437/228; 437/238
[58] Field of Search ................... 437/195, 228, 437/978, 228 PC, 238, 231; 156/644

[56] References Cited

U.S. PATENT DOCUMENTS

| | | | |
|---|---|---|---|
| 4,283,249 | 8/1981 | Ephrath ................................. | 156/643 |
| 4,872,947 | 10/1989 | Wang et al. ........................... | 156/653 |
| 5,070,036 | 12/1991 | Stevens et al. ....................... | 437/190 |
| 5,219,792 | 6/1993 | Kim et al. ............................. | 437/195 |
| 5,266,525 | 11/1993 | Morozumi ............................. | 437/195 |
| 5,270,254 | 12/1993 | Chen et al. ............................ | 437/190 |

FOREIGN PATENT DOCUMENTS

| | | |
|---|---|---|
| 0155699 | 9/1985 | European Pat. Off. . |
| 3164344 | 7/1988 | Japan . |
| 63-208243 | 8/1988 | Japan . |
| 2284447 | 11/1990 | Japan . |
| 4152656 | 5/1992 | Japan . |

OTHER PUBLICATIONS

Wolf et al., vol. I, Silicon Processing for the VLSI Era Lattice Press, 1986.

Kawai et al, "Interlayered Dielectric Planarization with TEDS–CVD and SOG" 1988 IEEE VLSI Multilevel Interconnection Conference, Jun. 1988, pp. 419–425.

S. Wolf, Silicon Processing for the VLSI Era, vol. 2, Lattice Press, Sunset Beach, CA, 1990, pp. 198–199, 232–234, 279–283, 532–533.

J. J. Hsieh, et al., "Directional Deposition of Dielectric Silicon Oxide by Plasma Enhanced TEOS Process", 1989 IEEE–VMIC Conference, Jun. 1989, pp. 411–415.

B. L. Chin et al., "Plasma TEOS Process for Interlayer Dielectric Applications", Solid State Technology, Apr. 1988, pp. 119–122.

*Primary Examiner*—Tom Thomas
*Assistant Examiner*—Lynn A. Gurley

[57] ABSTRACT

A method of manufacturing an interlayer dielectric for microelectronic devices having multiple conducting layers provides a planarized surface for deposition of subsequent layers and further prevents cracking of spin-on-glass by limiting spin-on-glass thickness to about 0.4 μm or less. A first dielectric layer is formed over a first conducting layer by means of reacting $Si(OC_2H_5)_4$ and $O_2$ at approximately 9 torr between 370° C. to 400° C., and a second dielectric layer is formed over the first dielectric layer by a method different than that used to form the first dielectric layer. After etching back the second dielectric layer, a spin-on-glass layer is formed. Spin-on-glass layer is etched back to provide a planar surface and a third dielectric layer is formed over the spin-on-glass layer. The resulting surface is ready for contact hole formation, deposition and patterning of subsequent conductive and insulating layers.

8 Claims, 2 Drawing Sheets

METHOD OF MANUFACTURING A MICROELECTRONIC INTERLAYER DIELECTRIC STRUCTURE

CROSS REFERENCE TO RELATED APPLICATIONS

This application is a continuation-in-part of U.S. Ser. No. 07/741,285 which was filed on Aug. 7, 1991, now U.S. Pat. No. 5,266,525. This application is also related to U.S. Ser. No. 08/092,834, filed Jul. 16, 1993 which is a division of U.S. Ser. No. 07/741,285 which was filed on Aug. 7, 1991, now U.S. Pat. No. 5,266,525.

BACKGROUND OF THE INVENTION

1. Field of the Invention

The present invention relates to manufacturing methods for a microelectronic interlayer dielectric structure, and more particularly relates to improvement in planarization and reduction of void formation in a multilayer metal system where the aspect ratio of first layer metal thickness to first layer metal spacing is on the order of 0.7.

2. Description of Related Art

A common practice in the manufacture of microelectronic devices and integrated circuits is to protect the semiconductor surface, as well as the metal layer surfaces with a covering insulator layer. These insulator layers are sometimes referred to as dielectric layers, or as passivation layers. Modern microelectronic semiconductor devices often require multiple layers of metal, one crossing over the other and separated by an interlayer dielectric. Interlayer connection points are provided through openings, or contact holes, formed for that purpose in the dielectric layers.

As metal spacing decreases to meet the requirements of VLSI/ULSI processing and circuit design, several problems begin to appear as a result of the non-planar intermetal dielectric surface. To prevent such problems it is well-known to planarize the intermetal dielectric.

A prior art method of manufacturing microelectronic devices having multilayer wiring, is shown in FIG. 2. A silicon substrate 11 has a field oxide layer 12 formed upon it. Subsequently a first metal layer 13 is formed on field oxide layer 12. In this example, metal layer 13 was formed by sputtering an Al alloy to a thickness of about 0.5 to 1.0 μm. After sputtering, first metal 13 was patterned to the required shape by photoetching. Silicon oxide film 24 was then grown in the vapor phase by plasma or heat reaction of a combustible gas such as $SiH_4$ and $O_2$ or $N_2O$, as an interlayer insulator, to a thickness typically on the order of 0.5 to 0.8 μm. Because of the need to planarize the interlayer dielectric, a spin-coated glass 16 of silanol and $P_2O_5$ dissolved in an alcohol is formed over silicon oxide film 24. Next, annealing at a temperature that would not damage first metal 13 was performed. The concentration of $P_2O_5$ mixed into the spin-coated glass was on the order of 1 to 5 mol %, and its purpose was to raise the stress relaxation of the spin-coated glass and the crack resistance effect.

After formation of the interlayer dielectric structure, contact holes were etched through glass film 16 and silicon oxide film 24. Contact etch was typically performed by reactive ion etching using gases such as $CF_4$, $CHF_3$ or $C_2F_6$.

A second metal layer 19 was formed by sputtering an Al alloy and patterning by well-known, conventional photoetching techniques. A passivation film 20 was formed over second metal 19, and finally a bond pad opening was formed in passivation film 20 for making external connections.

As the first-layer metal-to-metal spacings were decreased to achieve greater packing density, prior art devices experienced cusping of silicon oxide films 24 formed in the spaces between first-layer metal lines when silicon oxide films 24 were grown in the vapor phase with $SiH_4$ and combustible gas. Even though the prior art teaches the use of spin-on-glass to fill the cusps and troughs of the silicon oxide films 24, it has been found by the inventor that as metal-to-metal spacing decreases and the metal height to spacing aspect ratio reaches approximately 0.7, voids within the spin-on-glass regions are formed. It has also been found that where liquid spin-on-glass accumulates in U-shaped troughs, or channels, between first-layer metal lines, cracks in the spin-on-glass regions tend to form during subsequent processing steps. Crack 21, as shown in FIG. 2, is illustrative of this phenomenon. Both cracks 21 and voids 22 lead to reliability and yield losses.

Reliability and yield problems also arise when contact holes through intermetal dielectrics are etched anisotropically and therefore the side surfaces of the contact holes are nearly vertical. Vertical contact hole sidewalls result in poor step coverage by second metal layer 19. Poor step coverage in turn produces thin metal which is susceptible to deterioration due to electromigration.

It would be desirable to provide a taper, or slope, to the contact hole sidewalls to overcome the problem of poor second metal step coverage. While a high temperature reflow of spin-coated glass 16 might provide such a taper, this process step is not possible because first metal 13 cannot tolerate the temperature required to reflow spin-coated glass 16. There have been attempts to give an isotropic taper to the contact holes by means of wet etching with an HF system aqueous solution. Unfortunately, this HF etching cannot be used with the above-described interlayer dielectric as line widths and spacings are decreased, because the etch rate with the HF system aqueous solution is high and there is an unacceptable amount of side etching.

Another prior art method of manufacturing microelectronic devices having multiple layers of interconnect is disclosed in U.S. Pat. No. 4,775,550 to Chu et al. There, a three layer intermetal dielectric having a first dielectric material formed over a first conductive layer, a spin-on-glass layer which fills the low-lying regions of the first dielectric material, and a second dielectric material which provides a planar surface and isolates the spin-on-glass from any metal, is described. The problem with such a process is that spin-on-glass regions thicker than 0.4 μm tend to form cracks.

SUMMARY OF THE INVENTION

It is an object of the present invention to improve second metal step coverage of contact holes by using a four-layer intermetal dielectric and a combination wet etch/dry etch process to provide an isotropic taper for contact holes.

It is a further object of the present invention to prevent formation of cracks in the interlayer dielectric.

The interlayer dielectric of the present invention is disposed between layers of metal interconnect. The underlying foundation layers such as field oxide, implanted or diffused junctions, polysilicon and the like, may all be formed by any of the well-known deposition and etching processes for microelectronics.

The four layer intermetal dielectric structure of the present invention has a first silicon oxide film formed by a first film growth process. This film is disposed on a first conducting layer, typically metal-1.

A second silicon oxide film is formed over the first silicon oxide film by a second film growth process which is different from the first film growth process. Second silicon oxide film is then etched back to the point where the uppermost portions of first silicon oxide film are exposed.

A spin-on-glass layer is formed over the second silicon oxide layer. Spin-on-glass fills in the low lying regions of the surface and is therefore thickest in those regions between metal-1 lines. Spin-on glass is then etched back until the uppermost portion of first silicon oxide film is exposed, and the overall surface is planarized.

A third silicon oxide film is formed over spin-on-glass layer by the same film growth process used to form first silicon oxide layer.

Photoresist is applied to the planarized surface and patterned so as to expose the areas to be etched for interlayer contact holes. Etching is performed as a two-step wet etch/dry etch. By wet etching partially through the dielectric structure first, an isotropically tapered upper portion of contact hole is formed. By dry etching through the remainder of contact hole, vertical sidewalls are maintained, thus avoiding contact hole enlargement due to lateral etching. It will be easily appreciated by those skilled in the art that lateral enlargement of contact holes works against the achievement of submicron geometries.

The photoresist is removed, metal-2 is deposited and a topside passivation layer is formed over metal-2.

An advantage of the structure and method of the present invention is improvement of second metal step coverage around contact holes by using a four-layer intermetal dielectric and a combination wet etch/dry etch process to provide an isotropic taper for contact holes.

A further advantage of the present invention is prevention of cracks in the spin-on-glass portion of the intermetal dielectric.

Other objects, attainments and advantages, together with a fuller understanding of the invention will become apparent and appreciated by referring to the following description and claims taken in conjunction with the accompanying drawings.

DETAILED DESCRIPTION OF THE INVENTION

Overview and Terminology

Modern integrated circuits require multiple layers of conductors and similarly require interlayer dielectrics to physically and electrically isolate the conducting layers from each other. Each conducting layer is made up of a plurality of individual conducting lines which are of various lengths, widths, spacings and paths, rather than simply being a sheet of conducting material. The complex pattern of these conducting, or interconnect, layers typically results in an uneven, or non-planar, surface characteristic for a dielectric layer formed over such a complex interconnect layer. The interconnect lines are typically metal (e.g. Al) or metal alloys (e.g. Al-Cu).

A typical application of the inventive dielectric structure and process is in the manufacture of CMOS VLSI circuits having two layers of metal interconnect and vias for making connections between a first metal line and a second metal line. The metal layer closest to the substrate is called metal-1 and the metal layer above metal-1 is called metal-2. Vias are also often referred to as windows, or contact holes.

The inventive dielectric structure is generally thought of as an interlayer dielectric. However, because this structure is most often used between metal layers, it is also referred to as an intermetal dielectric.

Physical Structure and General Process Flow

The present invention utilizes a four layer intermetal dielectric structure to achieve (i) a planar base for deposition of subsequent layers; (ii) physical and electrical separation of the interconnect layers; (iii) the ability to form contact holes having isotropically tapered upper portions and anisotropic bottom portions; and (iv) a balancing of compressive and tensile stresses.

The interlayer dielectric of the present invention is disposed between layers of metal interconnect. The underlying foundation layers such as field oxide, implanted or diffused junctions, and polysilicon (or equivalent silicides) may all be formed by any of the well-known deposition and etching processes commonly used in microelectronics manufacturing.

Figure 1A:
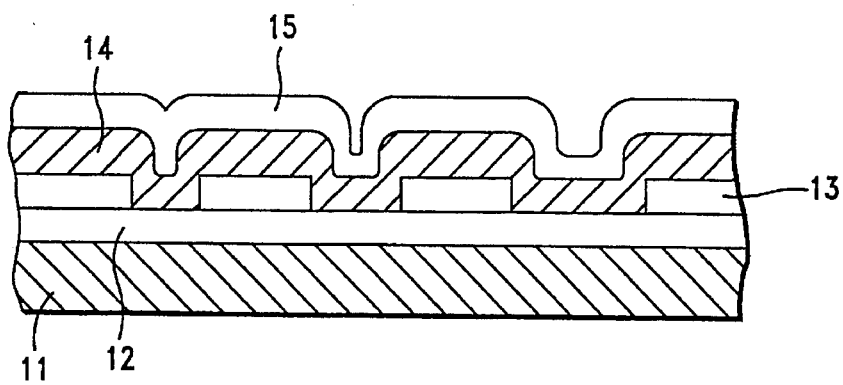
FIGS. 1(a)–1(e) are cross sectional views illustrating the structure and processing steps of the present invention.

The four layer intermetal dielectric structure of the present invention has a first silicon oxide film 14 formed by a first film growth process. This film is disposed upon a first conducting layer 111, typically metal-1. (FIG. 1(a)).

Figure 1B:
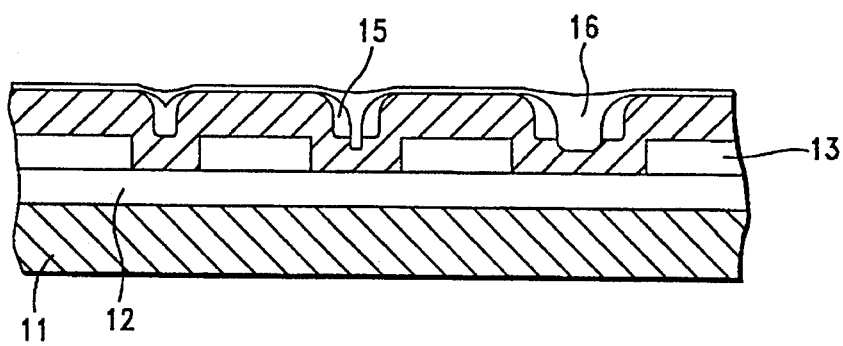

A second silicon oxide film 15 is formed over (i.e. on top of) first silicon oxide film 14 by a second film growth process which is different from the first film growth process. Second silicon oxide film 15 is then etched back, as shown in FIG. 1(b), to the point where the uppermost portions of first silicon oxide film 14 are exposed.

A spin-on-glass layer 16 is formed over said second silicon oxide layer 15. Spin-on-glass 16 fills in the low lying regions of the surface and is therefore thickest in those region between metal-1 lines 13. Spin-on glass 16 is then etched back until the uppermost portion of first silicon oxide film 14 is exposed, and the overall surface is planarized. (FIGS. 1(b)–(c)).

Figure 1C:
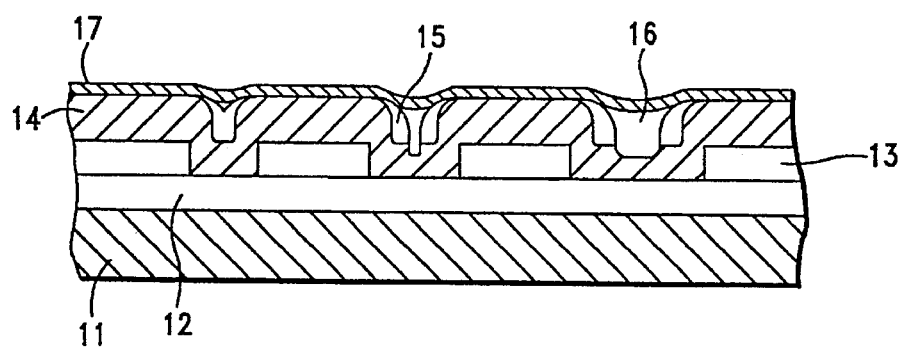

A third silicon oxide film 17, shown in FIG. 1(c), is formed over spin-on-glass layer 16 by the same film growth process used to form first silicon oxide layer 14.

Figure 1D:
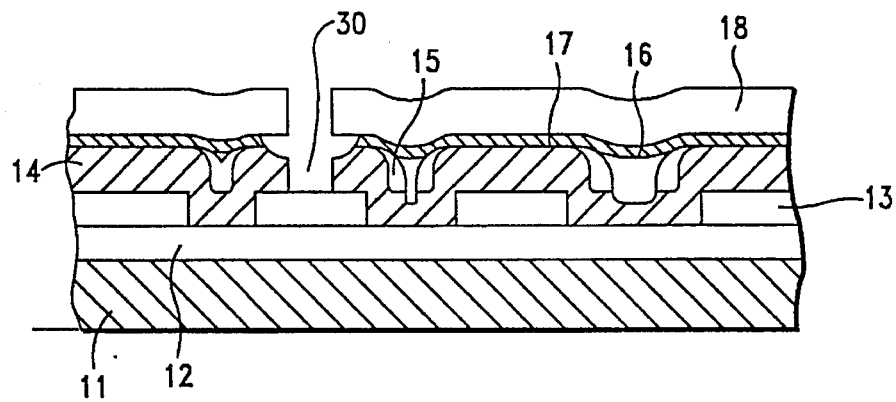

Photoresist 18 is applied to the planarized surface and patterned so as to expose the areas to be etched for interlayer contact holes, as shown in FIG. 1(d). Etching is performed as a two-step wet etch/dry etch. By wet etching partially through the dielectric structure first, an isotropically tapered upper portion of contact hole 30 is formed. By dry etching through the remainder of contact hole 30, vertical sidewalls are maintained, thus avoiding contact hole enlargement due to lateral etching. It will be easily appreciated by those skilled in the art that lateral enlargement of contact holes works against the achievement of submicron geometries.

Figure 1E:
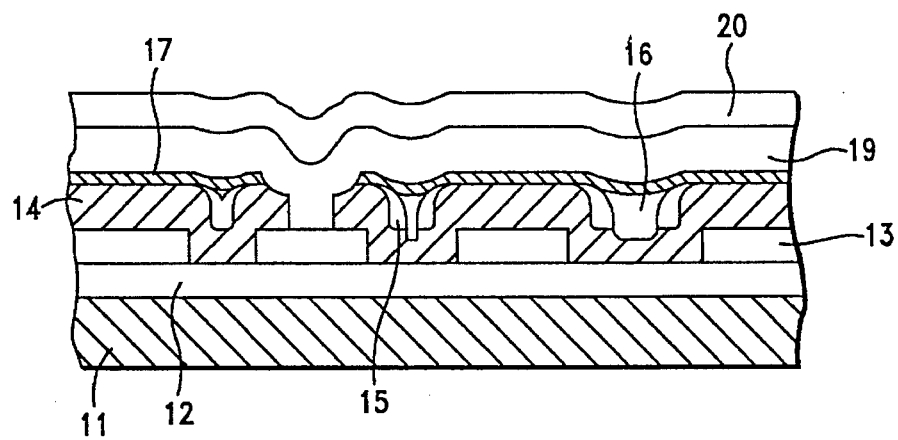
Figure 2:
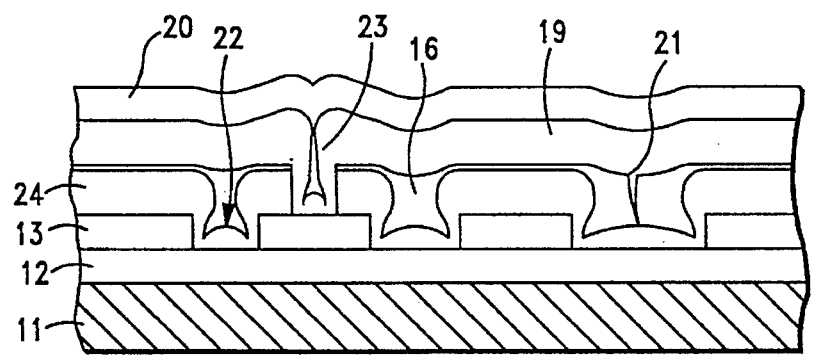
FIG. 2 is a cross sectional view showing a prior art three layer dielectric structure.

As can be seen from FIG. 1(e), photoresist 18 is removed, metal-2 19 is deposited and a topside passivation layer 20 is formed over metal-2. Again it will be appreciated by those skilled in the art that spin-on-glass 16 is isolated from any metal, thus preventing metal damage from phosphoric acid and collateral transistor damage from the resulting contamination.

Specific Process Flow

The invention is described with respect to a Si gate CMOS VLSI having two layers of metal interconnect with submicron design rules. While the present invention relates to an intermetal dielectric, various foundation layers are manufactured prior to the formation of the inventive dielectric structure.

In a Si gate CMOS VLSI device, insulation film 12 made of a silicon oxide film is formed by selective hot oxidation or grown in vapor phase on silicon substrate 11. After opening contact holes through insulation film 12, first metal 13 is applied by sputtering an Al-Cu alloy to a thickness of about 0.3 μm, after which patterning is done with a dry etch containing a halogen gas such as $Cl_2$. Of course, those skilled in the art will recognize that other conductive materials may be used in place of this Al-Cu alloy. In some cases, such as logic devices rather than memory devices, metal-1 may be about 0.5 μm thick.

The manufacturing of the dielectric structure of the present invention begins after metal-1 lines are formed as described above. In regard to the thickness ratio between first and second silicon oxide films 14, 15, it will be understood that if the total stress at time of layering is in the compression direction, there will be cracks in the silicon oxide film during the subsequent etching and annealing process steps. In the preferred embodiment, first silicon oxide film 14 is grown to about 0.6 μm by plasma vapor phase reaction of $Si(OC_2H_5)_4$ (TEOS) and $O_2$ at about 9 torr at 370° C. to 400° C. using a plane parallel plate apparatus, and second silicon oxide film 15 is formed to be approximately 0.4 μm thick by means of a reduced pressure heat reaction of $O_3$ and TEOS with an $O_2$ carrier at 60 to 100 torr and approximately 380° C. (FIG. 1(a)).

A broad range of possible conditions for formation of the first dielectric (silicon oxide in the preferred embodiment) layer is possible. For example, conducting the plasma vapor phase reaction of TEOS at a temperature of between approximately 300° C. and approximately 500° C., at a pressure of between approximately 2 and approximately 20 torr, and an RF power of between approximately 100 and approximately 1,000 W. Carrier gases such as He, At, or $N_2$ can be used. A film thickness of between approximately 2,000 Å and 10,000 Å is achieved. Of course, as is understood by those of skill in this field, film uniformity will vary as the process conditions are varied.

A broad range of possible conditions for formation of the second dielectric (silicon oxide in the preferred embodiment) layer is possible. For example, conducting the reaction of TEOS with $O_3/O_2$ at a temperature between 300° C. and 500° C., and at a pressure between 10 torr and atmospheric pressure. Carrier gases such as He, Ar, or $N_2$ can be used. Although the film can be formed with high temperature, it is preferred to use lower temperatures in order not to damage the low melting point metals used to form the underlying interconnect layers. The range of film thickness is typically 2,000 to 8,000 Å.

Silicon oxide films 14, 15, unlike prior ones using $SiH_4$ have no cusping, and the first silicon oxide film in particular is dense with good uniformity, superior anti-contamination properties and compression stress (for example, it curves convexly when grown on a Si wafer). Also, the second silicon oxide film is contacted around nearly 100% in the step difference portion, and while it also filled well in the channel portion, it has tensile stress and contains many OH ions.

Next, the level portions of second silicon oxide film 15 are removed by an anisotropic etch-back of about 0.45 μm, with a plasma etcher using gases such as $CHF_3$, $CF_4$ and Ar, leaving them as sidewalls in the spaces between metal-1 lines 13. After applying spin-on-glass 16 and annealing for 30 minutes in a $N_2$ atmosphere at about 400° C., spin-on-glass about 500 to 700 Å was accumulated on metal-1 lines 13, and a thickness under 0.4 μm accumulated in the space between metal-1 lines giving a planarized surface as seen in FIG. 1(b). Next, spin-on-glass 16 is removed at least where it was over first metal wiring 18 by sputter etching with a high frequency bias of 400 W in an Ar atmosphere at about $1\times10^{-4}$ torr. Reactive ion etching may be used in the process of removing spin-on-glass 16, but since the planarization will be inferior because the etching speed of spin-on-glass is considerably greater than that of the vapor phase grown silicon oxide film, it is preferred to do the removal by sputter etching, ion milling, or by an etch system low in selectivity. However, reactive ion etching can be suitable for mass production environments. In such a case, RF power between 200–1,000 W, pressure between 0.1 torr and 5 torr (0.1 torr to 2.5 torr is preferred), and gases such as $CHF_3$, $CH_4$, $C_2F_6$, or a mixture of these gases and an inactive gas can be used.

Next, third silicon oxide film 17 is grown to a thickness of about 500 Å by the same method as first silicon oxide film 14 (FIG. 1(c)). Then in order to open contact holes for contact between metal-1 lines and metal-2 lines, third and first silicon oxide films 17, 14 are wet etched to a collective depth of about 2,500 Å with an aqueous solution of a mixture of HF and $NH_4F$ using photoresist 18 as a mask, after which a contact hole is opened by dry etching the remaining first silicon oxide film 14 under a pressure of 300 mtorr using $CHF_3$, $CF_4$ and He gas (FIG. 1(d)). The result of applying a wet etch/dry etch combination to the interlayer dielectric of the present invention, is a contact hole with an isotropically etched upper portion and anisotropically etched lower portion. Photoresist 18, is then removed, An Al-Cu alloy is sputtered to a depth of about 1.0 μm to make second metal 19, after which plasma nitride passivation film 20 is grown as shown in FIG. 1(e).

While the thickness of third silicon oxide film 17 may be several hundred Å, over 500 Å is better for film thickness controllability.

Conclusion

Microelectronic devices manufactured in this manner achieve both planarization without being restricted to design rules which require metal spacing greater than 0.5 μm, and improvement in second metal step coverage of intermetal contact holes. The interlayer dielectric structure of the present invention can be used even when metal-1 and metal-2 are formed from dissimilar materials. For example, the conductive layers separated by the inventive dielectric structure may be poly-Si, a-Si, metal silicides, or conductive substances like TiN.

The planarization effect of the present invention can also be obtained when second silicon oxide film 15 formation is done with a heat reaction under ordinary pressure.

If a metal with a high reflex index, such as an Al alloy, is used, the metal surface exhibits grain chapping and the slope of the lower differential portion exhibits irregular reflection when exposed to ultraviolet light during a photo step. Such grain chapping and irregular reflections cause distortion (halation) in the overlying photoresist pattern which leads to inaccurate circuit formation. Therefore if a TiN layer, which is electrically conductive and high in light absorption, or a high melting point silicide layer is deposited on the Al alloy, the irregular reflection of irradiated light can be prevented thus enhancing accuracy of the photo process.

It has also been found that the inventive structure and process are compatible with metallization variations introduced for halation prevention.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the subjoined claims.

What is claimed is:

1. A method for manufacturing a microelectronic device having multiple conductive layers separated by a complex dielectric structure, comprising the steps of:

a) depositing a first conductive layer on said microelectronic device, wherein said step of depositing comprises sputtering a conductive material to a thickness greater than approximately 0.3 μm;

b) patterning said first conductive layer to form a plurality of individual conductive lines;

c) forming a first dielectric layer over said conductive lines by a first film growth process, wherein said first film growth process comprises the steps of reacting, in a plasma vapor phase reaction, $Si(OC_2H_5)_4$ and $O_2$ at a temperature in the range of approximately 300° C. to approximately 500° C., at a pressure in the range of approximately 2 torr to 20 torr, and at an RF power in the range of approximately 100 W to approximately 1,000 W, such that said first dielectric layer has compression stress;

d) forming a second dielectric layer, on top of said first dielectric layer, by a second film growth process, wherein said second film growth process comprises the steps of reacting, $Si(OC_2H_5)_4$ and $O_3/O_2$ at a temperature in the range of approximately 300° C. to approximately 500° C., at a pressure in the range of approximately 10 torr to approximately 760 torr, and using an inert carrier gas, such that said second dielectric layer has tensile stress;

e) etching said second dielectric layer to expose a portion of said first dielectric layer;

f) forming a layer of spin-on-glass over the surface of said first and second dielectric layers;

g) etching said spin-on-glass layer until the surface has been planarized;

h) forming a third dielectric layer, above said second dielectric layer, by said first film growth process;

i) etching contact holes through said third and first dielectric layers; and j) depositing a second conductive layer on the surface comprising said third dielectric layer and said contact holes.

2. The method of claim 1 wherein said step of forming said first dielectric layer, forms a dielectric layer that is between approximately 2,000 Å and approximately 8,000 Å thick.

3. The method of claim 1 wherein said inert carrier gas is a gas selected from the group consisting of He, Ar, and $N_2$.

4. The method of claim 1 further comprising the step of annealing for approximately 30 minutes in a $N_2$ atmosphere at approximately 400° C., after forming said spin-on-glass layer.

5. The method of claim 1 wherein said third dielectric layer is grown to approximately 500 Å.

6. The method of claim 1 wherein said third dielectric layer is grown to a thickness greater than approximately 500 Å.

7. The method of claim 1 wherein said step of etching said contact holes comprises the steps of:

a) wet etching said third and first dielectric layers to a collective depth of approximately 2,500 Å with an aqueous solution of HF and $NH_4F$; and b) dry etching the remaining first dielectric.

8. The method of claim 7 wherein said step of dry etching said remaining first dielectric is performed under a pressure of approximately 300 mtorr using $CHF_3$, $CF_4$ and He gas.

* * * * *